(12) United States Patent
Nair et al.

(10) Patent No.: US 9,461,355 B2
(45) Date of Patent: Oct. 4, 2016

(54) METHOD APPARATUS AND MATERIAL FOR RADIO FREQUENCY PASSIVES AND ANTENNAS

(71) Applicants: Vijay K. Nair, Mesa, AZ (US); Chuan Hu, Chandler, AZ (US); Shawna M. Liff, Gilbert, AZ (US); Larry E. Mosley, Santa Clara, CA (US)

(72) Inventors: Vijay K. Nair, Mesa, AZ (US); Chuan Hu, Chandler, AZ (US); Shawna M. Liff, Gilbert, AZ (US); Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 425 days.

(21) Appl. No.: 13/853,977

(22) Filed: Mar. 29, 2013

(65) Prior Publication Data

US 2014/0293529 A1    Oct. 2, 2014

(51) Int. Cl.
| | |
|---|---|
| *H01Q 1/38* | (2006.01) |
| *H01Q 1/22* | (2006.01) |
| *G06F 1/16* | (2006.01) |
| *H01Q 23/00* | (2006.01) |
| *H01L 23/00* | (2006.01) |

(Continued)

(52) U.S. Cl.
CPC .............. *H01Q 1/2291* (2013.01); *G06F 1/16* (2013.01); *H01L 23/295* (2013.01); *H01L 23/66* (2013.01); *H01L 24/19* (2013.01); *H01L 24/96* (2013.01); *H01Q 1/2283* (2013.01); *H01Q 23/00* (2013.01); *H01L 21/568* (2013.01); *H01L 23/3121* (2013.01); *H01L 2223/6677* (2013.01); *H01L 2224/0401* (2013.01); *H01L 2224/04105* (2013.01); *H01L 2224/12105* (2013.01); *H01L 2224/16225* (2013.01); *H01L 2224/24137* (2013.01); *H01L 2224/24195* (2013.01); *H01L 2924/12042* (2013.01); *H01L 2924/15311* (2013.01); *H01L 2924/15321* (2013.01); *H01L 2924/181* (2013.01); *H01L 2924/19105* (2013.01)

(58) Field of Classification Search
CPC ..................... H01Q 1/2283; H01L 2223/6677
USPC .................................................. 343/700 MS
See application file for complete search history.

(56) References Cited

U.S. PATENT DOCUMENTS

| | | |
|---|---|---|
| 2004/0183643 A1 | 9/2004 | Brunner |
| 2006/0256017 A1 | 11/2006 | Ishizaki |

(Continued)

FOREIGN PATENT DOCUMENTS

| | | |
|---|---|---|
| CN | 101689481 | 3/2010 |
| JP | 2004-529508 | 9/2004 |

(Continued)

OTHER PUBLICATIONS

Korean Patent Appln. No. 2014-0035863, English Translation of the Notice of Preliminary Rejection, issued Jul. 7, 2015, 6 pages.

(Continued)

*Primary Examiner* — Ramon M Barrera
(74) *Attorney, Agent, or Firm* — Blakely, Sokoloff, Taylor, & Zafman LLP

(57) ABSTRACT

A method apparatus and material are described for radio frequency passives and antennas. In one example, an electronic component has a synthesized magnetic nanocomposite material with aligned magnetic domains, a conductor embedded within the nanocomposite material, and contact pads extending through the nanocomposite material to connect to the conductor.

29 Claims, 12 Drawing Sheets

(51) Int. Cl.
*H01L 23/29* (2006.01)
*H01L 23/66* (2006.01)
*H01L 21/56* (2006.01)
*H01L 23/31* (2006.01)

(56) References Cited

U.S. PATENT DOCUMENTS

| | | |
|---|---|---|
| 2008/0122047 A1 | 5/2008 | Honer et al. |
| 2008/0149736 A1 | 6/2008 | Kim et al. |
| 2009/0040734 A1 | 2/2009 | Ochi et al. |
| 2009/0321923 A1 | 12/2009 | Swaminathan |
| 2010/0099365 A1 | 4/2010 | Aramaki et al. |
| 2010/0133256 A1 | 6/2010 | Bandoh et al. |
| 2012/0062439 A1 | 3/2012 | Liao et al. |
| 2012/0217431 A1 | 8/2012 | Nakamura |
| 2013/0015564 A1 | 1/2013 | Matsuki et al. |

FOREIGN PATENT DOCUMENTS

| | | |
|---|---|---|
| JP | 2004529508 | 9/2004 |
| JP | 2006-319867 | 11/2006 |
| JP | 2006319867 | 11/2006 |
| JP | 2007514308 | 5/2007 |
| JP | 2008192283 | 8/2008 |
| JP | 2008/238416 | 10/2008 |
| KR | 10-2010-0011988 | 2/2010 |

OTHER PUBLICATIONS

European Search Report for EP Counterpart Application No. 14162134.2, 11 pgs., (Jul. 23, 2014).

The final notice of preliminary rejection from Counterpart KR Patent Application No. 2014-0035863, Mailed Feb. 1, 2016, 6 pages.

Chinese Search Report for counterpart Chinese Patent Application No. 201410121564.0, dated May 19, 2016, 3 pages.

N-Aminoethyl-3-aminopropyltrimethoxy-silane (AEAPS)

3-glycidyloxypropyltrimethoxysilane (GPTS)

METHOD APPARATUS AND MATERIAL FOR RADIO FREQUENCY PASSIVES AND ANTENNAS

FIELD

The present description relates to the field of radio frequency passive devices and packaging and in particular to passive devices and packaging using small scale antennas on nanomagnetic composites.

BACKGROUND

Small form factor devices like ultrabook computers, tablets, and smartphones accommodate as many as five to seven antennas or more to cover Wi-Fi, Bluetooth, cellular data networks such as LTE (Long Term Evolution) or 3G (Third Generation Cellular), FM (Frequency Modulation) radio, GPS (Global Positioning System), RFID (Radio Frequency Identification), NFC (Near Field Communication) and DTV (Digital Television broadcasting) services, among others. The number of antennas, their sizes and their RF isolation requirements put severe restrictions on the device's form factor and design. Traditionally discrete components have been used for both antennas and inductors which were typically placed on the motherboard. If antenna size can be significantly reduced, the overall size of the communication device can be reduced or more of the device may be used for other purposes.

As an example a typical popular tablet computer may have four antennas, a planar inverted F cellular band antenna (GSM/WCDMA/LTE) and a Wi-Fi/Bluetooth antennas among others. The cellular band antenna may measure roughly 35 mm by 10 mm and the Wifi/Bluetooth antenna may measure roughly 16 mm by 10 mm. The antennas may also have complex shapes to optimize reception that impact design freedom for the rest of the device.

Efficient RF antennas are just one example of small form factor magnetics that are suitable for future microelectronic packages used in mobile, small scale, and wireless systems. Inductors for power delivery and other components are also desired. While discrete components placed on the motherboard have been used for both antennas and inductors, this can significantly impact the size of the final product. The size of such components is physically limited by the materials and electrical specifications. While high relative permeability can allow for smaller devices, high permeability materials tend to also be conductive. This causes eddy current losses and other drawbacks.

BRIEF DESCRIPTION OF THE DRAWING FIGURES

Embodiments of the invention are illustrated by way of example, and not by way of limitation, in the figures of the accompanying drawings in which like reference numerals refer to similar elements.

DETAILED DESCRIPTION

Figure 1:
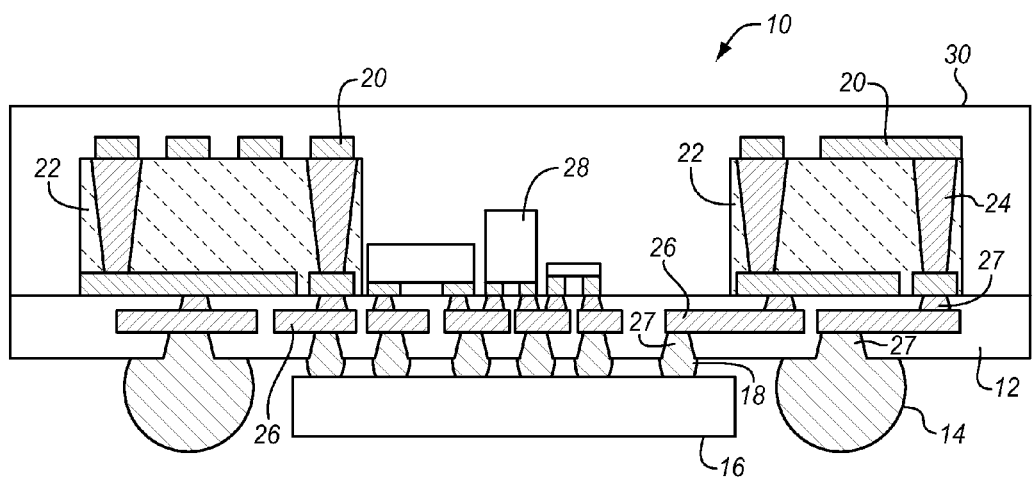
FIG. 1 is a simplified cross-sectional diagram of an RF package according to an embodiment of the invention.

Very small size antennas may be fabricated using a nanomagnetic material layer deposited on an organic package substrate. The antenna can be fabricated on a nanomagnetic composite material layer that is itself laminated or molded on to an organic package substrate. The antenna may then be integrated with other RF components to produce a very small RF package or a module useful, for example, in ultrabooks, tablets, and smartphones.

The size of an antenna is related to at least three important factors: RF frequency; the permittivity; and the permeability of the antenna substrate material These relationships can be written mathematically as:

$$\lambda = \lambda_0 / (\in_r \mu_r)^{1/2} \quad \text{(Eq. 1)}$$

where $\lambda$ is the wavelength in the substrate having permittivity $\in_r$ and permeability $\mu_r$; $\lambda_0$ is the free space wave length (c/f); c is the velocity of light in free space and f, the RF frequency for the antenna.

$$\eta = \eta_0 (\mu_r / \in_r)^{1/2} \quad \text{(Eq. 2)}$$

where $\eta$ is the impedance in the substrate having permittivity $\in_r$ and permeability $\mu_r$, and $\eta_0$ is the impedance of free space As indicated by these relations (Eqs. 1 and 2), the antenna size depends on $\lambda$ which in turn depends the product of $\in_r$ and $\mu_r$. The impedance $\eta$ depends on the ratio of $\mu_r$ and $\in_r$. As a result, the size of an antenna can be reduced by using a nonmagnetic dielectric material (i.e. a material having $\mu_r$ of 1) that has a high permittivity $\in_r$.

However, when the antenna size decreases as permittivity is increased, the impedance also decreases. When the impedance mismatch increases (i.e: $\eta_0/\eta$), the energy transfer from the antenna is decreased. This in turn lowers antenna efficiency and bandwidth (data rate that the antenna can carry). Magnetic materials of very high permeability are readily available and used in many applications, however they are not suitable for fabricating antennas because the permeability of these materials falls precipitously at high frequencies (i.e. above a few hundred MHz).

A nanomagnetic composite material layer that has higher permeability and permittivity at RF frequencies can be formed on the top of a semiconductor package. Antenna structures can be designed over the nanomagnetic material resulting in a smaller and more efficient antenna. Antennas can be designed on a nanomagnetic substrate and then attached to the package substrate as surface mount components. A three times or greater reduction in the area of an antenna can be achieved with nanomagnetic materials. For example a 35 mm by 10 mm antenna may be reduced to about 20 mm by 5 mm. A 16 mm by 10 mm antenna may be reduced to about 10 mm by 10 mm. This is close to the size of some semiconductor packages, allowing the antenna for an wireless communication applications to be formed on the package.

By physically attaching the antenna to the package, RF performance is further improved due to the shorter interconnect distance and reduced RF insertions loss. There is also no need for expensive coaxial RF cable to connect the RF transceiver to an external antenna that might be situated on the rim of a tablet or smartphone. Elimination of the coaxial RF cable reduces RF loss and cost.

The nano-magnetic composite layer may be synthesized by impregnating magnetic nanoparticles in epoxy resin and then curing the composite material formed by the impregnation. Such a nanocomposite substrate layer retains its magnetic properties at higher frequencies (e.g. up to about 5-10 GHz) with reasonable permittivity (e.g. about 10-20) and permeability (e.g. about 1.5-4). This material can be synthesized using commercially available nanomagnetic particles (e.g. size of about 20 to 50 nm) and epoxy compounds.

As described in more detail below, the synthesized material can be integrated on a package substrate or other surface by screen printing or molding. The antenna structures can be fabricated on top of this nanomagnetic layer to achieve the very small form factor mentioned above. This nanomagnetic material may also by screen printed or laminated on top of the package to reduce the size still further. The antenna structure may be created by plating copper on top of the nanomagnetic layer. Through vias can be created on the nanomagnetic layer to connect the antenna to the RF circuits and ground on the package.

As described below, nanoparticle magnetic composite layers can be constructed as part of the fabrication of a package. An antenna can then be fabricated on this nanoparticle substrate layer. The antenna can then be integrated with RF transmit and receive circuits within the package to produce a small form factor RF transceiver module with about the same size as an RF circuit package.

Figure 9:
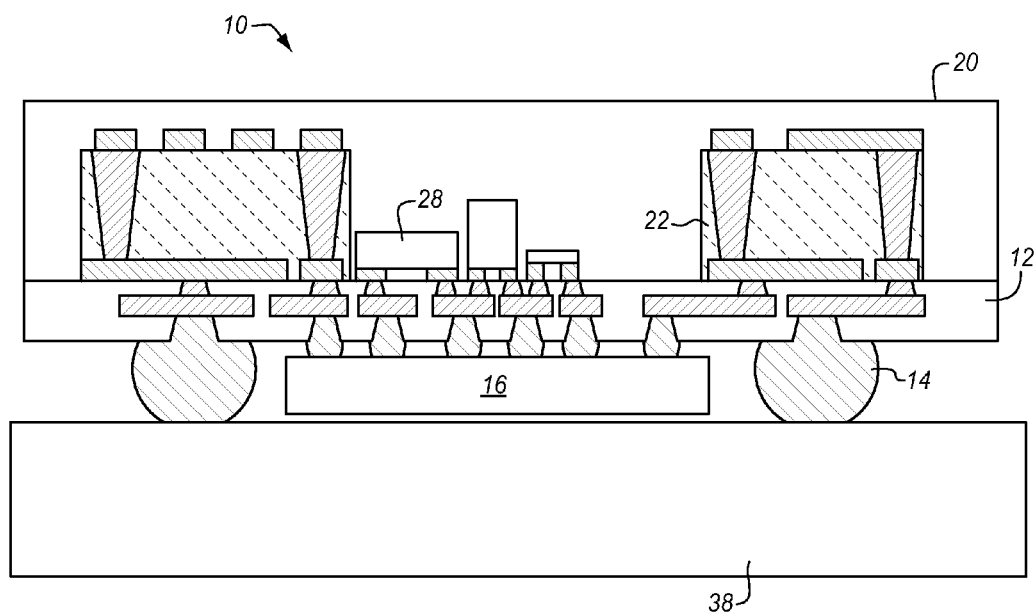
FIG. 9 is cross-sectional diagram of the package formed as shown in FIGS. 3-8.

FIG. 1 is a cross-sectional diagram of an RF package with antennas, an optional RF circuitry die and a connection pad. The package 10 is built on a substrate, in this case a buildup layer or layers (BUL) 12 which may be attached to a printed circuit board, such as a system board, motherboard or logic board (38 as shown in FIG. 9), with solder balls 14 of which only two are shown, although there may be many more. The BUL carries a die 16 that contains RF electronic circuits. Vias 27 through the BUL connect the die with antenna structures 20 also attached to the buildup layer(s) 12.

The package 10 contains a nanoparticle magnetic composite 22 that is selectively laminated over the buildup layer(s) 12. Vias 24 through the composite material connect with conductive paths 26 through the substrate to connect the antennas 20 through the composite and the substrate to the die 16. The antennas may also be coupled through these vias to external power or other connections 14 on an external device such as a motherboard (not shown). Alternatively, the antennas 20 may be constructed on the nanomagnetic material 22 separately and then later attached to the RF package buildup layer(s) 12 as a surface mount component.

The package substrate or BUL 12 also carries a variety of additional discrete components 28 coupled to the silicon die and the antennas. These will be referred to as passives, however, the discrete components may be passive or active. The package is covered with a dielectric such as a molding compound 30 to seal and insulate the antennas, the passives, the vias, and the various connections. The molding compound is selected to be transparent to the radio frequencies which the antennas are intended to receive and transmit.

A passive device component 28 such as a capacitor may be electrically connected to a line 26, such as a signal line to an antenna. In such an embodiment, a direct current (DC) coming from a signal port in the die 16 may be blocked or rerouted by the passive device 28 so that the DC current does not travel along the signal line or via 24 connected to an antenna (which is designed to receive only a radio frequency (RF) signal). In another embodiment, the passive device component may function as a frequency selector for a signal line in the package going to an antenna due to the impedance of the signal coming from a signal port in the die.

An active device component 28 such as a power amplifier, a low noise amplifier or RF switch may be first formed based on a gallium arsenide die before being attached to the substrate 12. In such an embodiment, the active device like the power amplifier may amplify or send selected RF signal to the antenna 20 through a via 24. The receive signals coming from the antenna may be routed through an antenna switch and a low noise amplifier device to select and amplify the received RF signal. This amplified signal is routed along a signal line 26 through the substrate 12 to the die 16. In an alternative embodiment, the active device may be a SOC (System on a Chip) die which includes a power amplifier.

Figure 2:
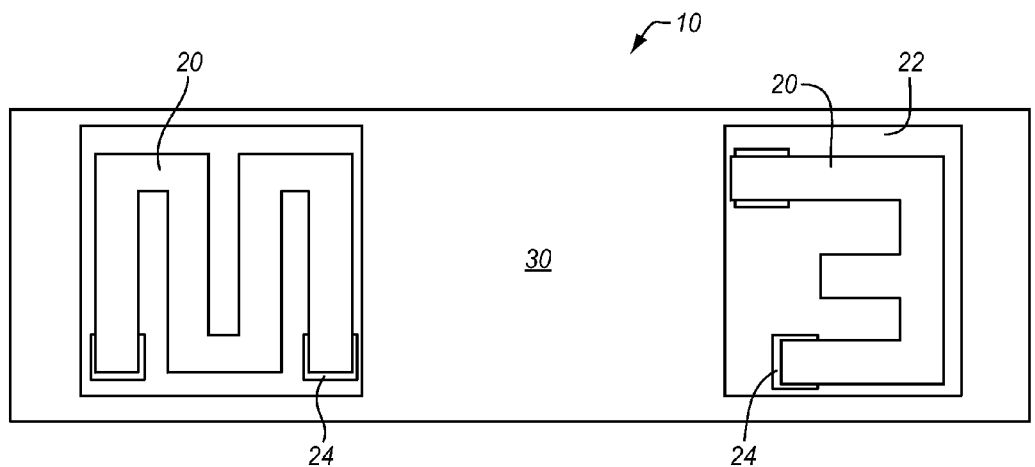
FIG. 2 is a simplified top elevation diagram of the RF package of FIG. 1.

FIG. 2 is a top elevation view of the package 10 of FIG. 1 in which the antenna structures and composite material can be seen but the substrate and passive components cannot be seen. The antenna structures 20 can have a variety of different shapes and rest on top of the composite material 22. The antennas are coupled at appropriate locations through vias 24 to other components so that the signals received by the antennas may be carried for down conversion, demodulation, baseband processing and other RF stages and to the die 16.

As shown below, the nanoparticle magnetic composite material can be integrated on top of the package substrate and then molded on the top of the package. The antenna structures 20 may be patterned on that composite surface 30. The RF output signal lines from the circuits are connected to these antennas to complete the RF transceiver module. The connection vias 24 to the RF circuits of the die may be created by drilling in the molding material or in any of a variety of other ways. Vias can be through the entire thickness of the molding material or only partially through the molding material to connect to the top surface of the components embedded in the molding material.

Figure 3:
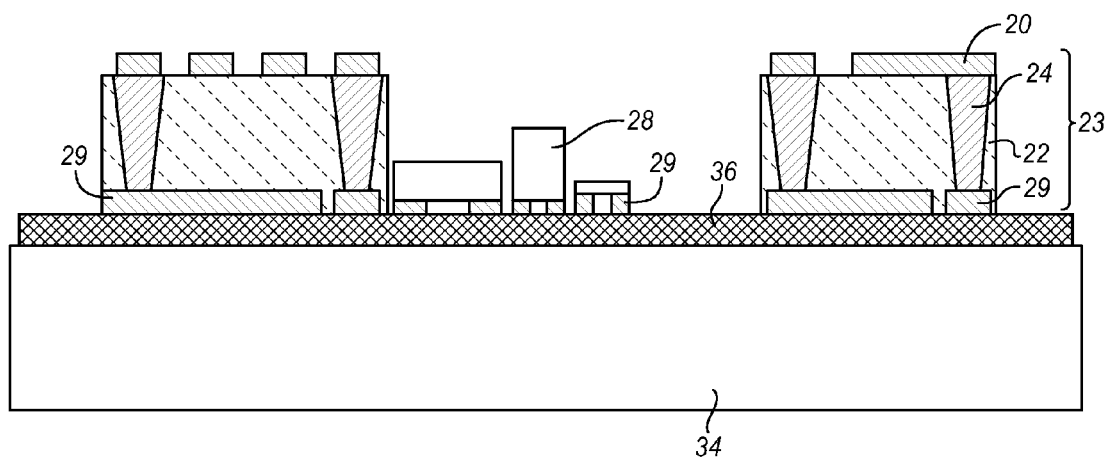
FIGS. 3-8 are cross-sectional diagrams of a sequence of stages in forming a package with antennas including a nanomagnetic composite material according to an embodiment of the invention.

FIGS. 3 to 9 are cross-sectional views of a package such as that of FIGS. 1 and 2 in progressive stages of manufacture. FIG. 3 is a side cross-sectional diagram of an initial configuration of components for a process of forming a single package similar to that of FIGS. 1 and 2. In FIG. 3, a temporary carrier 34 is formed to carry the other components. In an alternative embodiment, the carrier is a fixed substrate. The temporary carrier may be much larger than shown, such as a wafer, so that many packages are formed at the same time across the surface of the carrier. The carrier substrate can be any planar substrate, such as tape, silicon wafer, glass, metal, or polymer.

An adhesive 36 is applied to the top of the carrier to hold passives 28, nanomagnetic antennas 23, including the material 22, metal 20, via 24 and metal pad 2, and any other components to the carrier. The components can be passive device components and active components. Passive components can include band pass filters, capacitors, inductors, resistors, and crystals for clock generation. Active components can include power amplifiers and RF switches.

The passive components 28 and the nanomagnetic antennas include pads 29 that are placed over the top of the carrier. Vias 24 can then be drilled through the composite material and the antenna structures 20 patterned over the composite. In another embodiment, the nanomagnetic layer is selectively laminated on the substrate to antenna structures that are designed on top of the nanomagnetic composite material. The passives are typically fabricated in a separate process with connection pads 29 to allow them to be attached to and connected through a substrate. The composite material and antenna structure may be fabricated separately and then attached to the carrier 34 or fabricated directly on the temporary carrier.

Figure 4:
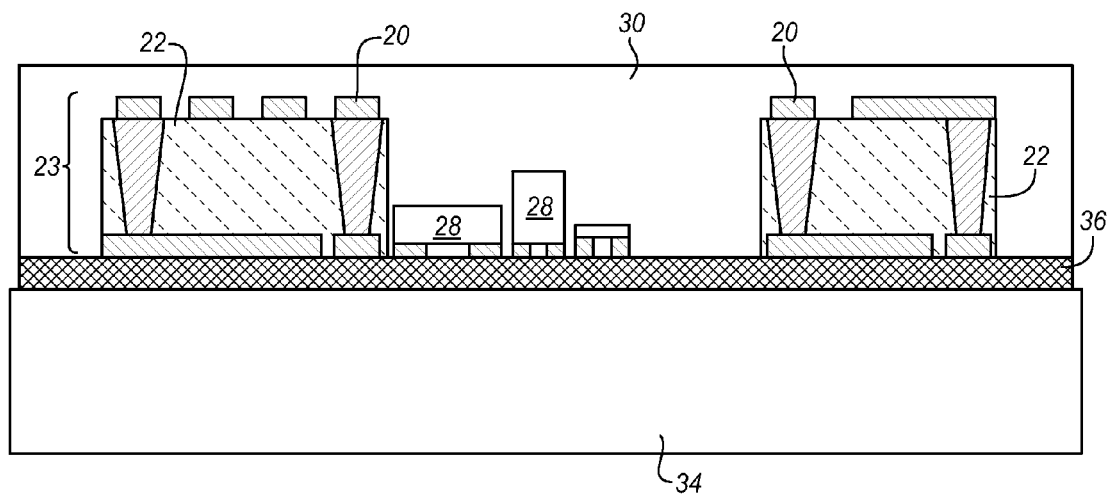

In FIG. 4 a molding compound 30 is applied over the composite antennas 23 and passives 28 to embed the passive components and the nano composite antenna 23. The molding compound may then be cured to give solid mechanical support to the components on the package. The molding compound may be applied in any of a variety of manners including spin coating, injection molding, compression molding, and transfer molding. For example, the molding compound can be a thermosetting material such as epoxy resin, phenolic resin, polyimide, and poly-benzoxasole (PBO). The molding compound may also be filled. In an embodiment, the molding compound comprises approximately 90% filler, such as silica particles. The molding compound layer is then fully cured to solidify the alignment of the device components and provide rigidity for handling.

Figure 5:
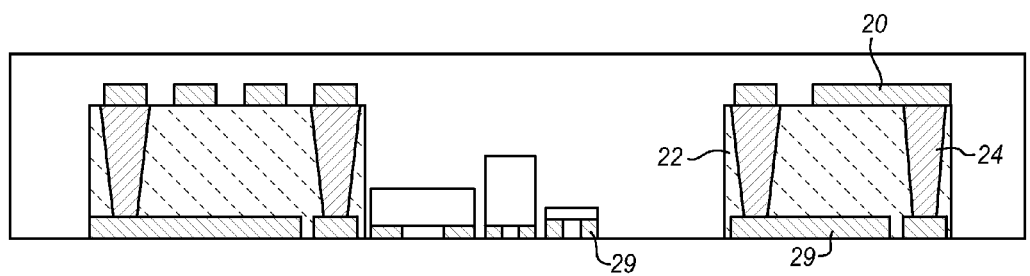

In FIG. 5 the molding compound 30 has been released from the temporary carrier 34 by dissolving the adhesive. The adhesive may be selected so that it acts as a release agent after the molding compound is fully cured. The adhesive can then be separated from the bottom of the molding compound by proper temperature treatment. Removing the carrier 34 exposes the metal pads 29 that were formed on the passives and antennas. The adhesive and carrier may be released by peeling, laser lift off, and ultraviolet (UV) irradiation. As illustrated, the exposed surface for each of the device components which was previously in contact with the carrier substrate may be coplanar with the exposed surface of the molding compound layer which was previously in contact with the carrier substrate. This provides a flat surface upon additional substrate layers may be formed.

Figure 6:
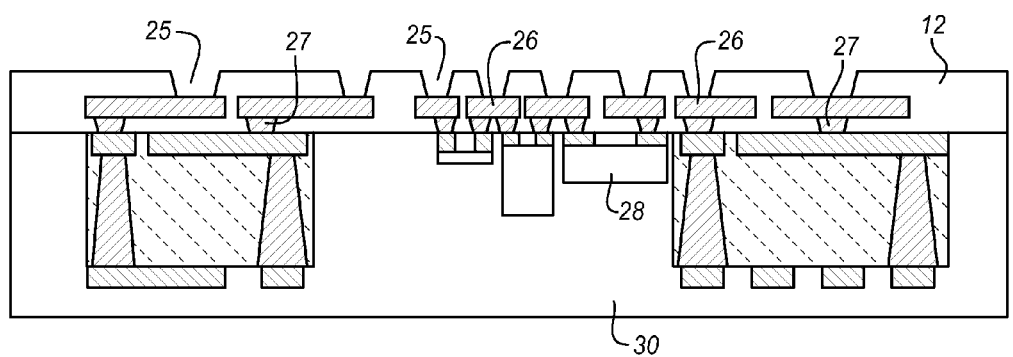

In FIG. 6, the package has been flipped. Typically the package will be formed with many other packages on a wafer so the entire wafer is flipped. A new substrate 12 is built up over the molding compound 30. The new substrate is formed with as many copper pathways 26 at as many levels as are desired to connect the antennas 23 and the passives 28 and to support their intended functions. Solder or metal paths 27 are provided to form vias. In one embodiment, a single redistribution layer (RDL) fan-out and buildup layer are formed as the substrate 12 on the coplanar surfaces.

In some embodiments, the patterned RDL with one or more traces 26 is first formed, followed by depositing a buildup layer over the RDL and patterning the buildup layer to form a plurality of openings 25, which may expose contact pads or traces. A variety of dielectric materials may be used to form the buildup layer. In an embodiment, a photosensitive polyimide is used. In such an embodiment, the photosensitive polyimide is cured by UV irradiation after patterning to form openings.

Figure 7:
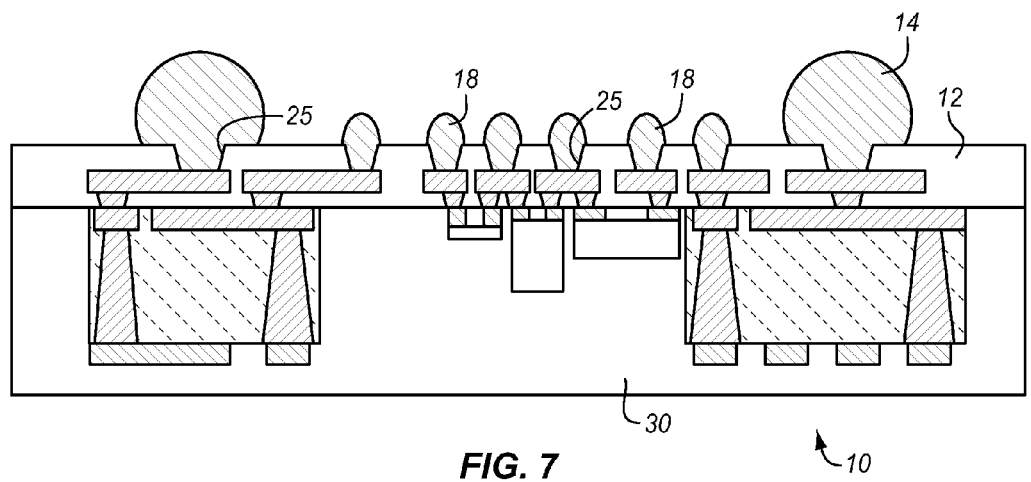
Figure 8:
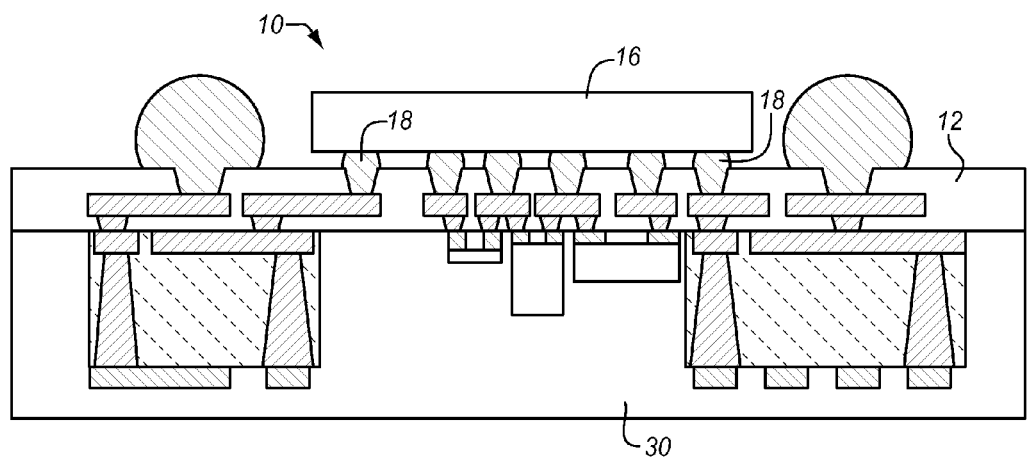

In FIG. 7, solder balls 14, 18 are attached to the redistribution layer or substrate 12 in the openings 25 which were formed for that purpose. In FIG. 8, a die 16, formed in a separate process, is attached to the central solder ball structure 18. In embodiments, the die 16 is electrically bonded to the single RDL directly vertically adjacent the passives but on the opposite side of the RDL 12. Such a connection can be made by pick and place of the active die 16 followed by solder reflow, or thermal compression bonding (TCB). As illustrated, the bump pattern for solder balls of the die 18 are aligned with the discrete components 28 for minimum lateral routing and fan-out, which can reduce the (x, y) form factor dimensions. Alternatively, the die may be electrically bonded to the substrate with wire bonds (not shown).

In FIG. 9, the package 10 carrying the die 16 and the antennas 23 is bonded to a circuit board 38. A ball grid array 14 or any other suitable structure may be used to attach the package to the board. The solder balls 14 may be in the form of conductive bumps arranged along a periphery of the substrate. The inner and outer conductive bumps 14, 18 may be formed using a variety of processes including screen printing or a microball ball grid array (BGA). The conductive bumps 14 for the PCB have a height larger than the height of the conductive bumps 18 or solder balls that attach the die to the substrate. These higher bumps may be placed on the substrate prior to electrically bonding the die 16 to the substrate 12. As shown in FIG. 7 all of the conductive bumps large 14 and small 18 are placed on the substrate at the same time or with different steps. The die 16 is then attached to the substrate as shown in FIG. 8 before the substrate is attached to the PCB.

Figure 10:
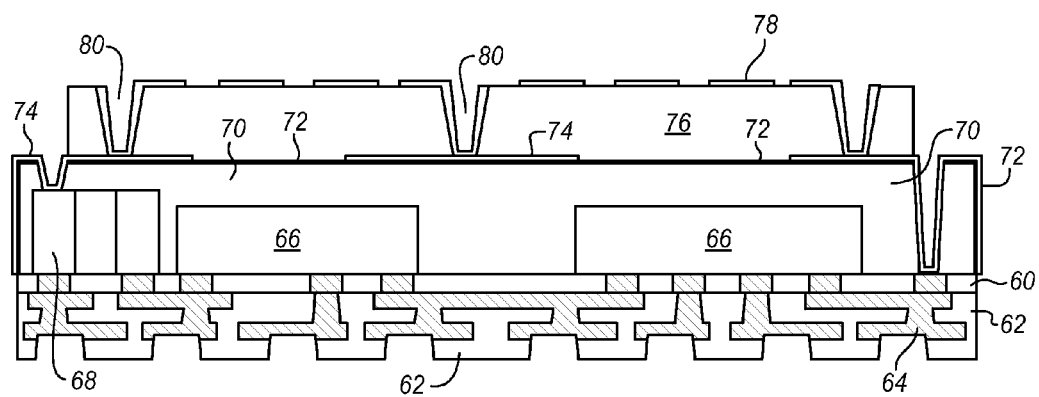
FIGS. 10-15 are cross-sectional diagrams of a sequence of stages in forming an alternative package with antennas including a nanomagnetic composite material according to an embodiment of the invention.

FIG. 10 is a cross-sectional view of an alternate form of a package according to another embodiment. A dielectric substrate 60 is attached above a routing layer 62, populated with metal pathways 64, to interconnect various components. One or more dies 66 and other components 68, such as passive elements, are attached on top of the dielectric substrate 60.

A molding compound 70 is applied over the dielectric substrate 60 to seal and protect the die and the passives and to hold them in place. A second dielectric layer 72 is formed over the molding compound 70 and metal pathways 74 are formed on top of the second dielectric layer 72. A nanoparticle composite material 76 can then be formed over the dielectric layer 72. Once the composite material 76 has been formed, antenna structures 78 can be formed over the composite material. Vias 80 may be drilled into the composite material through the molding compound down through to the interconnect layers 64 as desired to form the intended connections. In the example of FIG. 10, the antennas 78 are exposed on the top of the package while the dies 66 and passives 68 are protected within the molding compound 70.

FIGS. 11 to 15 are cross-sectional views of a package such as that of FIG. 10 in progressive stages of manufacture.

Figure 11:
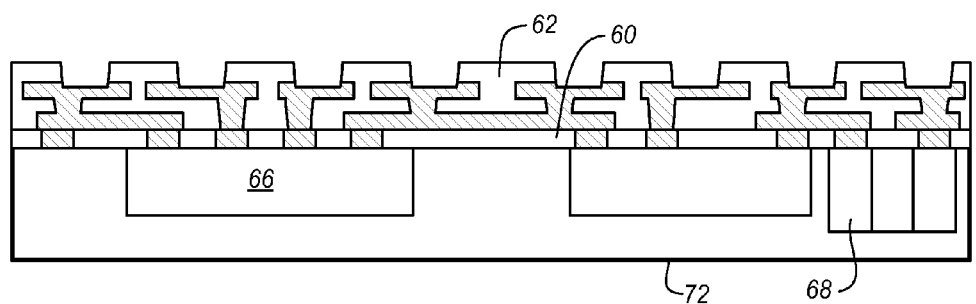

FIG. 11 is a cross-sectional view of an initial starting structure for forming the package shown in FIG. 10. According to FIG. 11 dies 66, such as system on chip (SOC) dies, are embedded in a molding compound 70 in a manner similar to that shown and described in FIGS. 3 to 6 and then attached to a substrate 60 and routing layer 62.

Figure 12:
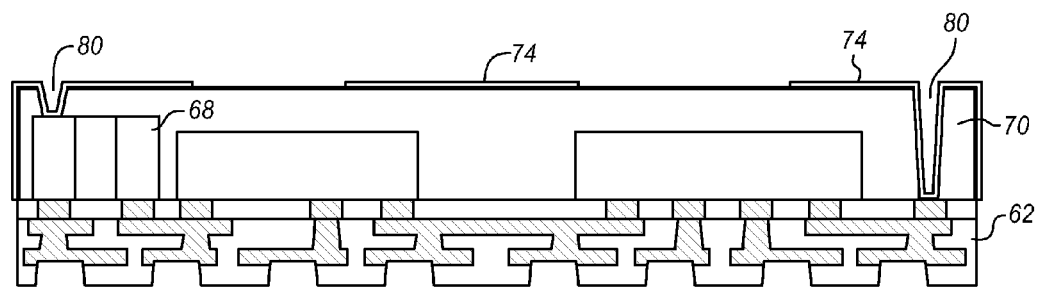

In FIG. 12 the wafer carrying the dies and the routing layer is flipped back so that the top surface of the molding compound 70 is exposed and the routing layer is not. Vias 80 are drilled through the molding compound and a metal layer 74 is applied to plate, coat, or fill the vias to provide conductive paths through the molding compound to passives 68 or to the routing layer 62 to make connections with the die or external components (not shown).

Figure 13:
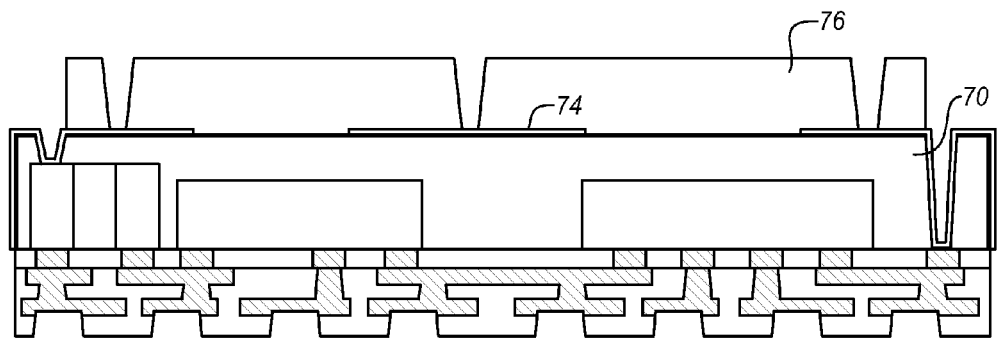
Figure 14:
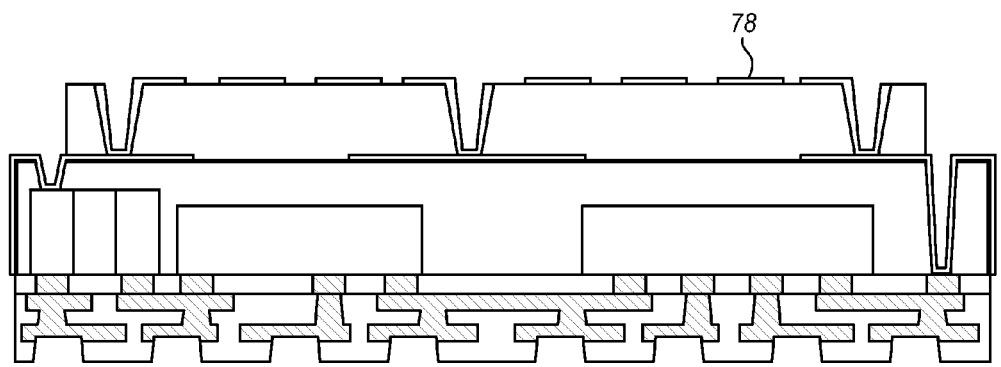

FIG. 13 shows the nanoparticle composite material 76 formed over the molding compound 70 and the metalized layer 74. In FIG. 14 the antenna structures 78 are formed over the nanoparticle composite material. The antenna structures may be formed by copper plating to form any desired shape and size.

Figure 15:
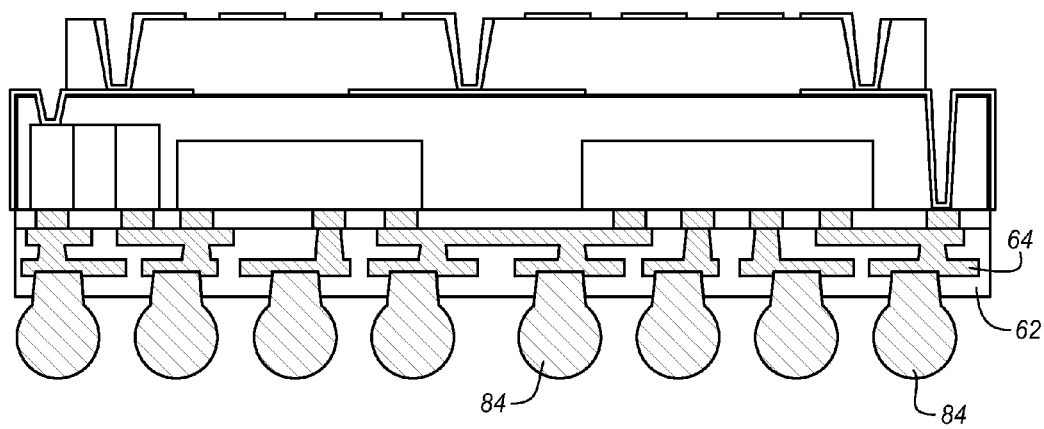

In FIG. 15, a ball grid array or other attachment mechanism 84 is formed on the routing layer 62 to allow the package to be attached to a larger device such as a motherboard or logic board. The substrate and routing layers may be made of any of a variety of different materials. An FR4 substrate may be used for many applications including the LTE band (about 700 MHz).

The magnetic nanocomposite formulation 22, 76 may be tuned and fabricated to create a high performance inorganic/organic nanocomposite with aligned magnetic domains. This aligned magnetic nanocomposite material is well-suited for RF antennas and inductors. The fabrication may include surface treatments and chemically functional passivated, single domain, magnetic nanoparticles.

The composite material can be formed using an organic, thermosetting resin, similar to a CUF epoxy resin, that has low viscosity or is flow-able at low to moderate temperatures. Upon exposure to higher temperatures above the cross-link activation temperature, the resin can chemically bond to a nanoparticle via surface treatment. A magnetic field is applied during the application of a particular temperature profile such that magnetic particles can rotate freely enabling magnetic domain alignment and then subsequent vitrification or hardening of the alignment. The temperature profile may be used to flow the resin or encourage magnetic domain rotation and chemically couple, i.e. cross-link or covalently bond, the organic resin to the magnetic nanoparticles.

Single-domain magnetic domain nanoparticles may be used. The nanoparticles may include a passivation layer, e.g. $SiO_2$. The passivation tends to keep dispersions of the magnetic nanoparticles stable and unaggregated. There are a variety of different ways to passivate the particles. In one embodiment, the particles are passivated with a sol-gel process. Using sol-gel ultrasonic cavitation, particle aggregates are fragmented and reactivity is promoted. In conjunction with the sol-gel processing, silica coated particles can be obtained. Silica coated particles may be more easily dispersed in organic solvents or resins than core particles without a passivation layer.

Figure 16A:
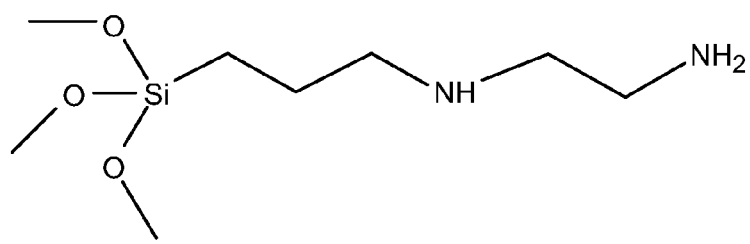
FIG. 16A is a diagram of a formula of a coating for silica nanoparticles of a nanomagnetic composite material according to an embodiment of the invention.
Figure 16B:
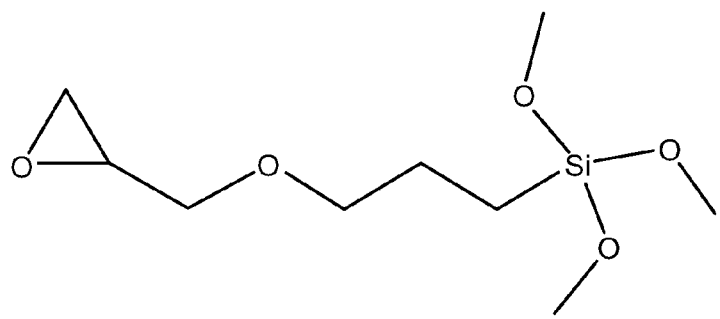
FIG. 16B is a diagram of an alternative formula of a coating for silica nanoparticles of a nanomagnetic composite material according to an embodiment of the invention.

The silica nanoparticles may be surface treated to modify the viscosity and surface energy of the particle and to promote covalent bonding between the particles and the matrix. The silica nano-particles may be coated with any of variety of different surface treatments including an aminosilane such as N-Aminoethyl-3-aminopropyltrimethoxysilane (AEAPS) as shown in FIG. 16A. In this case the silane portion of the treatment adheres to the silica particle surface while the amine portion hangs free and can react with an epoxy resin. Other surface treatments, silane or otherwise may be used depending the choice of organic resin for the nanocomposite. Alternatively, a combination of aminosilane and 3-glycidyloxypropyltrimethoxysilane (GPTS) as shown in FIG. 16B may be employed so that the epoxide ring and amine end group may covalently link and tightly couple the particles with a minimal use of additional organic binder.

In the example fabrication processes described above, the nanocomposite material may be spread into a mold or cavity via shear, similar to a solder paste or other granular organic/inorganic mixtures. Volume fractions of silica nanoparticles to resin in excess of 80 volume percent may be used if an optimized bi-dispersed system is used to spread the resin. In such a case, the ratio of large particle to small particle is as high as possible and the ratio of the volume fraction of large particles divided by the volume fraction of large and small particles, ranges from 0.7 to 0.8. Consequently, all that is needed for the latter, greater than 20 volume percent of the formulation, is a polymeric binder that allows the particles to be easily spread and can covalently crosslink the particles using a thermal profile once the magnetic domain alignment is achieved and an activation temperature is reached.

By tuning the surface treatment of the passivated, magnetic nanoparticles and the corresponding resin, the dielectric and mechanical properties of the organic material and even the amount of contraction upon crosslinking can be optimized for use as an inductor or with an RF package and antennas.

In the fabrication processes described above, the solution of resin and passivated nanoparticles can be paste printed, slit coated, screen printed or applied by any means feasible into a package cavity or mold. The temperature is then increased to a level ($T_{align}$) below the activation temperature of the resin crosslinking. This reduces the viscosity of the solution and makes it easy for the spherical magnetic nanoparticles to rotate. At this temperature, a magnetic field is applied across the particles to align the domains of the particles. Once alignment is achieved the temperature is increased above the activation temperature. The higher temperatures induce crosslinking. The crosslinking locks the aligned particles into position. Alternatively, other crosslinking stimuli i.e. UV radiation may be used in lieu of or in addition to the thermal heating. As shown and described above, the resulting magnetic nanocomposite material can be applied and cured in a package cavity or when formed in a mold released and then embedded in microelectronic packages or surface mounted.

Figure 17A:
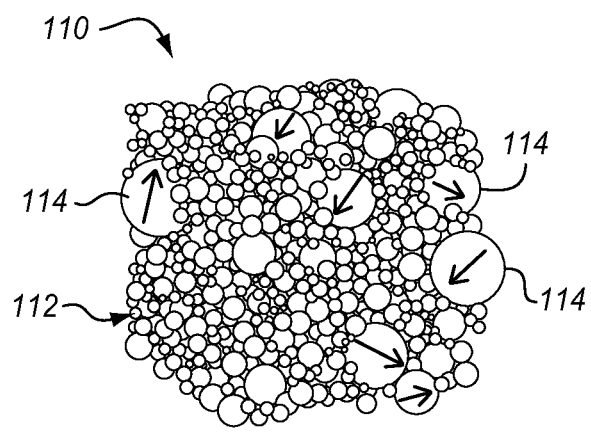
FIG. 17A is a diagram of a nanomagnetic composite material with nonaligned magnetic domains according to an embodiment of the invention.

FIG. 17A shows a nanocomposite material 110 formed of resin 112 filled with nanomagnetic particles 114. The nanoparticles 114 are randomly oriented as indicated by the arrows. The organic binder is used to fill a generic cubicle cavity and therefore has such a shape. The particular shape of the material and the amount of fill may be modified to suit any particular implementation or complex shape.

Figure 17B:
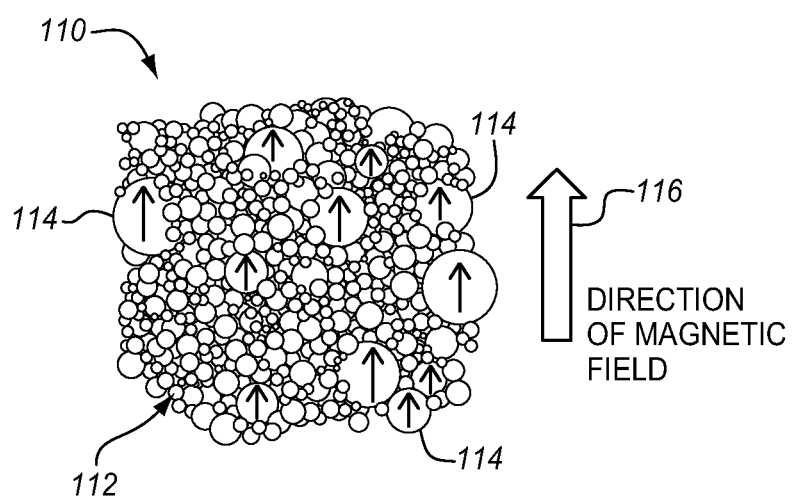
FIG. 17B is a diagram of the nanomagnetic composite material of FIG. 17A after magnetic domains are aligned according to an embodiment of the invention.

FIG. 17B shows the same material 110 or particle 114 filled resin 112 in which the magnetic fields of the nanoparticles 114 are locked in alignment. The particles are aligned by the application of a magnetic field 116 while the resin is at an elevated temperature $T_{align}$, above the ambient temperature $T_{amb}$ and below the resin's activation temperature $T_{act}$. Once the particles are aligned as shown, the temperature is elevated above the activation temperature to a lock temperature $T_{lock}$ that locks the magnetic nanoparticles into the aligned position.

In order to further improve the packing density of the nanocomposite, the alignment lock-in process can be done under an applied pressure. Alternatively, a resin that undergoes significant contraction upon crosslinking can be used.

A variety of different resin formulations may be used, such as resins that are used for capillary underfill applications. The resin may be designed to be low viscosity at temperatures from 90-110° C. and then to crosslink at temperatures in excess of 125° C. This allows the granular mixture to flow easily prior to covalent bonding. The particle size distribution can be adjusted to maximize the volume fraction of particles in the epoxy. For example, the size ratio of big spherical particles to little spherical particles and the corresponding concentration can be optimized to push the maximum packing fraction to 88 volume %.

As described, a strong magnetic field may be applied across the epoxy composite to align each particle domain to the governing field. While it may be difficult for the packed nanoparticles to move via shear, particle rotation is still easy upon exposure to the magnetic field. Rotation is easy in part because each spherical particle is not linked to its neighbors until the temperature is increased. Local friction and hydrodynamic interactions are therefore minimized. The alignment may be improved by optimizing the passivation thickness of the magnetic particles to ensure independent alignment. The choice of parameters for any particular resin and nanoparticle combination will depend on the particular materials that are selected and the nature of the package materials to which the resin will be applied.

Additional applications utilizing the nanocomposite material and process described above are possible including inductors, both uncoupled and coupled, transformers and other applications which require a magnetic material to be used in a small form factor with high frequency performance. The particular specifications of the nanocomposite material may be adapted to suit a variety of different applications.

Figure 18A:
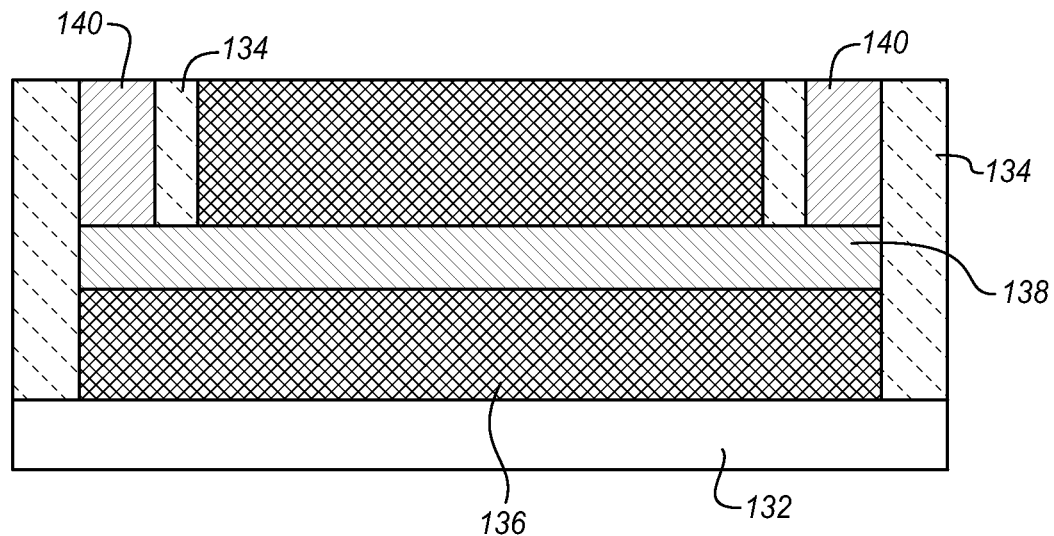
FIG. 18A is a cross-sectional diagram of an inductor formed using a nanomagnetic composite material according to an embodiment of the invention.
Figure 18B:
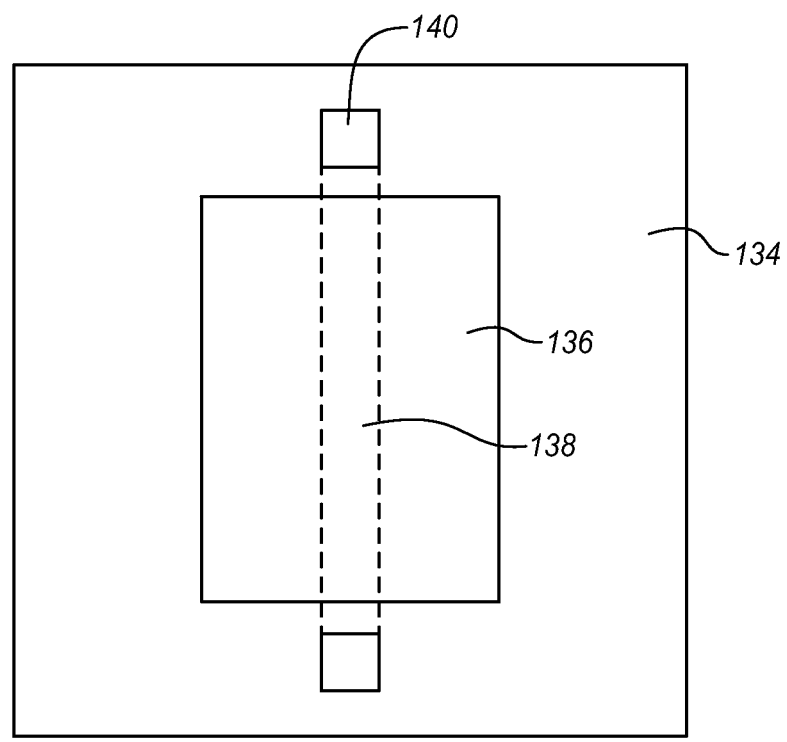
FIG. 18B is a top elevation diagram of the inductor of FIG. 18A.

FIG. 18A is a cross-sectional diagram of an uncoupled inductor which might be used in a high frequency voltage regulator circuit or in a variety of other applications. The inductor is built upon a substrate 132 which may be shared with many other components or used only for the illustrated inductor. The substrate may be silicon, BUL, glass, or any of a variety of other materials dielectric or conducting. In one embodiment dielectric retainers 134 are formed around the inductor to prevent the material from flowing. In a second embodiment the dielectric retainers are not required if the viscosity of the resin is sufficiently high that it will not flow during the subsequent processing. FIG. 18B is a top elevation view of the inductor of FIG. 18A. The dielectric forms a wall on four sides of the inductor. The rectangular shape is shown as an example. The inductor may be formed in different shapes to satisfy different packaging and performance requirements.

A first layer of the nanocomposite magnetic material 136 is deposited within the dielectric boundary and processed. A conductor 138, such as copper is formed on this magnetic layer 136 and then a second magnetic layer is deposited, processed and patterned to form a stripline inductor. In this case the conductor is enclosed by additional magnetic material. Additional dielectric or magnetic material may be formed over the conductor and vias 140 may be formed to provide contact pads to the inductor. FIG. 18B shows that the primary copper conductor 138 is covered by the nanocomposite magnetic material 136; however, connections 140 are accessible to connect the inductor to other components.

Using the straight conductor, a single turn inductor is formed, however, the conductor may have a variety of different shapes to form additional turns or attributes to control the electrical specifications of the device. Coupled inductors can also be fabricated in this manner by adding additional conductor lines. A toroidal inductor may be formed using a single layer of the nanocomposite magnetic material. Windings may then be formed around the magnetic layer in a toroidal configuration. The nanocomposite magnetic material in this case acts a core for the inductor. Other devices may also be formed. The inductor may be a passive in a package with or without an antenna. It may also be used in a power supply or other microelectronic device.

Figure 19:
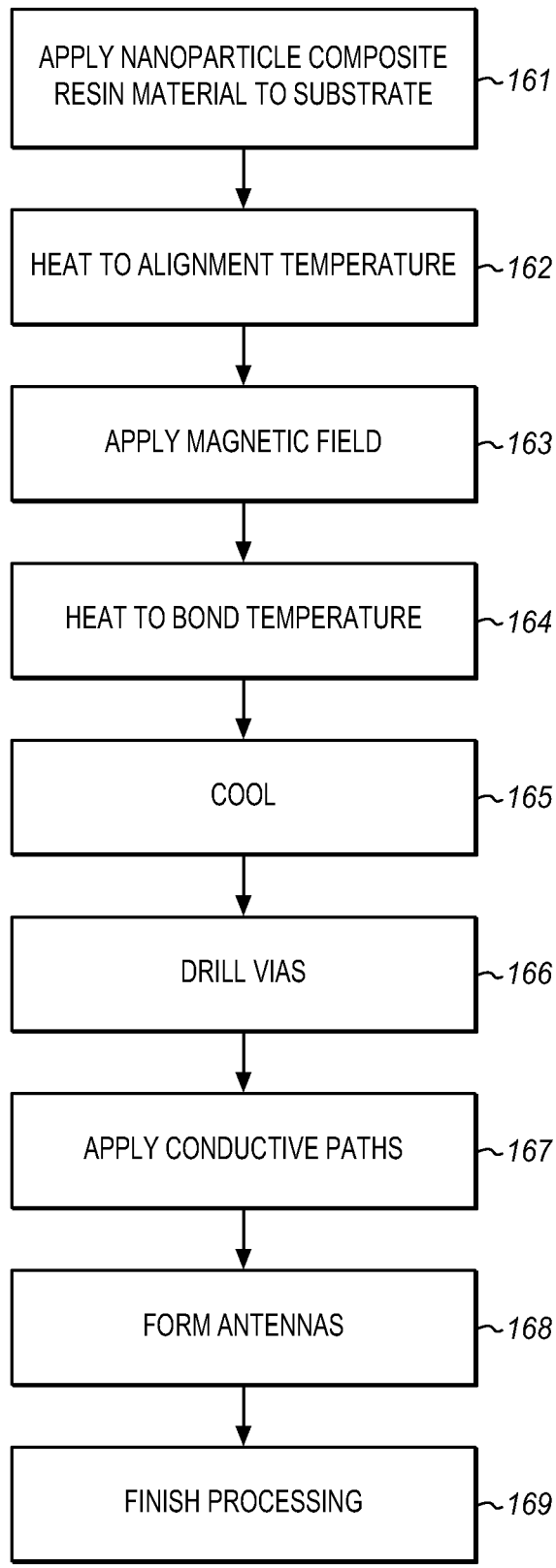
FIG. 19 is a process flow diagram of forming a microelectronic package according to an embodiment of the invention.

FIG. 19 is a process flow diagram of forming a nanocomposite material antenna structure as described above. At 161, a nanoparticle composite resin material is applied to a substrate. This may be applied by to the substrate by paste printing, screen printing, slit coating, spreading, jet dispensing, or other techniques. Molds or stencils may be used to determine the shape and size of the resulting composite material. The composite, as described above is a nanoparticle filled resin, such as a polymeric binder. The nanoparticles are magnetic and may be first coated in one or more layers with silanes or other materials to improve the disperse-ability with in or compatibility to the resin. The surface treatment may also be selected to increase binding or cross-link-ability with the resin.

The substrate may include additional circuitry or conductive pathways to other circuitry or both. The substrate may also carry other RF devices such as capacitors, resistors and other passive devices. The substrate may alternatively be a temporary carrier that is later removed and replaced with other devices, components, or substrates. As shown above, the substrate may carry one or more dies on the same surface as the nanoparticle composite resin or on the surface of the opposite side.

At 162, the composite and the substrate are heated to an alignment temperature, a temperature at which the resin has a low viscosity. This temperature is high enough to allow the magnetic nanoparticles to move about rotationally and perhaps also in shear movement. In some embodiments, this temperature is between 90-110° C., however, the particular temperature depends on the composition of the resin and the nanoparticle filler.

At 163 a magnetic field is applied to the composite to align the nanoparticles. The magnetic field is applied at the alignment temperature so that the nanoparticles are able to rotate into alignment with the applied magnetic field. Alternatively, the magnetic field may first be applied and then the composite is heated to allow the nano-particles to align as the temperature increases. After the nanoparticles are aligned at 164, the resin is heated to a bond temperature. This temperature is sufficient to lock the nanoparticles into position, for example, by causing covalent bonds between the nanoparticles and the resin. In some embodiments this is a temperature above 125° C., however, the temperature depends on the nature of the resin. At 165, the resin is allowed to cure and to cool.

At 166, vias are drilled through the resin and, depending on the particular configuration, through the substrate. The vias are to allow the applied antennas to connect with circuitry or pathways in the substrate or in some other device on the opposite side of the resin.

At 167 conductive paths are applied into the drilled vias and, depending on the particular configuration, across the top surface of the composite. These paths allow for RF and electrical connections to be made across and through the composite to connect antenna structures to each other and to other devices in the eventual package. The conductive paths may be made from copper, aluminum, silver, or any other suitably conductive material and may be applied by vapor deposition, inkjet deposition, lithography, metal plating or in any of a variety of other ways.

At 168 the antennas structures are formed and connected to the conductive paths created at 167 to allow the RF connections to the circuitries. The shapes and configuration of each antenna may be adapted to suit the particular frequency and modulation that is to be received or transmitted through the antenna. The antennas may be formed in any of a variety of different ways including printing, metal plating and deposition.

Finally, at 169, the package processing is finished. The operations used to finish the package may vary depending on the particular package design. As shown in the examples above, the finishing operations may include covering the resin and antennas in a molding compound, attaching semiconductor dies, attaching a substrate, and attaching solder ball or a solder ball grid array. The package may also be finished by attaching a cover or any of a variety of other structures, substrates, or components.

Figure 20:
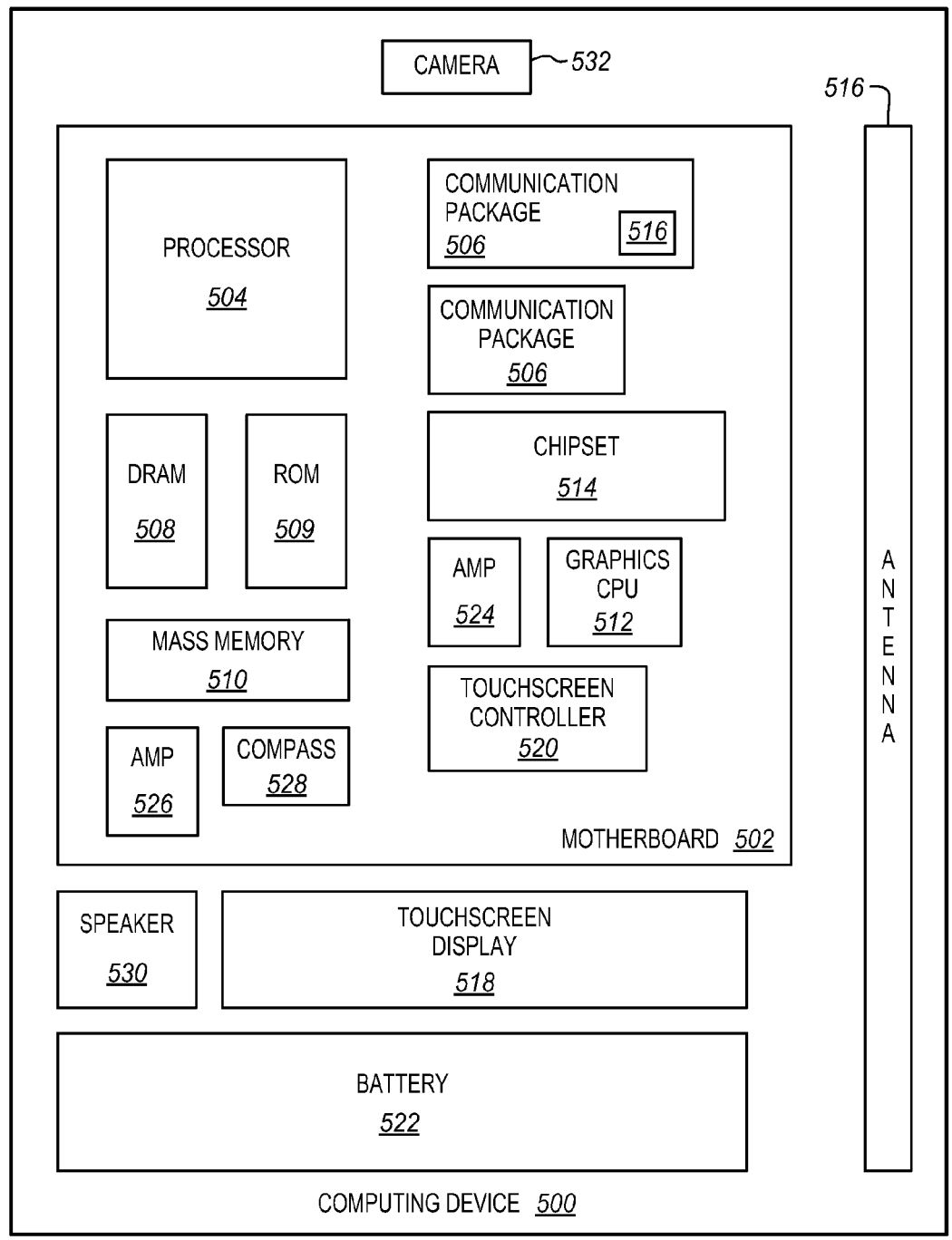
FIG. 20 is a block diagram of a computing device incorporating a microelectronic package according to an embodiment of the invention.

FIG. 20 illustrates a computing device 500 in accordance with one implementation of the invention. The computing device 500 houses a system board 502. The board 502 may include a number of components, including but not limited to a processor 504 and at least one communication package 506. The communication package is coupled to one or more antennas 516. The processor 504 is physically and electrically coupled to the board 502. In some implementations of the invention. At least one antenna 516 integrated with a communication package 506 and is physically and electrically coupled to the board 502 through the package.

The nanomagnetic material-based antennas described herein allow its integration to the communication package 506 due to its smaller footprint, thereby decreasing the footprint of the board 502 and the computing device 500. The computing device may also have other antennas that are not integrated on to the chip set package. In further implementations, the communication package 506 is part of the processor 504. Any one or more of these communications chips may include antennas as described herein. Any one or more of the other components may be formed using the nanomagnetic composite material as described herein.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication package 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication packages 506. For instance, a first communication package 506 may be dedicated to shorter range wireless communications such as Wi-Fi and Bluetooth and a second communication package 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a semiconductor package with a substrate configured for electrical connection to a system board, a synthesized magnetic layer connected to the substrate, and an antenna over the magnetic layer. The package may also have a semiconductor circuit die and the antenna may be coupled to the die with vias that extend through the magnetic layer. The die may be connected to the substrate opposite the antenna and the antenna is coupled to the circuit by vias formed in the substrate.

In embodiments, the package may have a package cover and the magnetic layer is screen printed over the package cover. The package cover may be formed of a molding compound. The package may have a package cover and the magnetic layer be on the substrate and the package cover formed over the substrate, the magnetic layer and the antenna. The antenna may be formed of copper plating. The magnetic layer may be formed of magnetic nanoparticles cured in an epoxy resin. The nanoparticles may be aligned using a magnetic field while being cured. The magnetic nanoparticles may be passivated silane coated silica particles and the magnetic layer include a polymeric binder.

Some embodiments pertain to an electronic component that includes a synthesized magnetic nanocomposite material with aligned magnetic domains, a conductor embedded within the nanocomposite material, and contact pads extending through the nanocomposite material to connect to the conductor. The conductor may be a copper strip, and the contact pads each at opposite ends of the strip to form an inductor. The copper strip may be linear to form a single turn inductor. A substrate may carry the nanocomposite material and the conductor and dielectric walls may isolate and contain the nanocomposite material.

Some embodiments pertain to a method including applying a magnetic nanocomposite material to a package having a substrate, the nanocomposite material having magnetic nanoparticles in an epoxy resin, aligning the magnetic fields of the magnetic nanoparticles, curing the resin to maintain the alignment of the magnetic nanoparticles, applying conductive paths to the nanocomposite material, and forming connectors to the conductive paths to complete an electronic device. The conductive path may be a single turn inductor coil. The magnetic fields may be aligned by heating the epoxy resin, applying a magnetic field, and allowing the resin to cure with the magnetic field applied. The magnetic nanoparticles may be passivated and silica coated. The magnetic nanoparticles may be surface treated with a silane compound. The resin may be an organic heat cured resin.

The method may further include forming antennas on the nanocomposite material and connecting the antennas to the connectors. The method may further include forming a cover over the substrate, wherein applying the nanocomposite material comprises applying the material over the cover, and wherein forming the antennas comprises forming the antennas over the nanocomposite material.

Some embodiments pertain to a synthesized magnetic nanocomposite material including a plurality of magnetic nanoparticles, and an organic heat cured resin. The magnetic nanoparticles may be passivated and silica coated. The magnetic nanoparticles may be surface treated with a silane compound. The magnetic particles may fill the resin in excess of 80 volume percent. The magnetic particles may have a variety of different sizes within a range of between 50 nm and 20 nm. The magnetic particles may be aligned using a magnetic field while being cured. The magnetic particles may comprise passivated silane coated silica particles. The resin may include a polymeric binder.

Some embodiments pertain to a computing device with a system board having a main processor coupled to the system board, a package having a package substrate coupled to the system board and an antenna, the antenna being formed over a synthesized magnetic layer connected to the substrate. The package may include a semiconductor circuit die and the antenna may be coupled to the die with vias that extend through the magnetic layer. The package may include a package cover and the magnetic layer be screen printed over the package cover. The magnetic layer may be on the substrate of the package, the package further comprising a package cover formed over the substrate, the magnetic layer and the antenna. The antenna may be formed of copper plating. The magnetic layer may be formed of magnetic nanoparticles cured in an epoxy resin and aligned using a magnetic field while being cured.

What is claimed is:

1. A semiconductor package comprising:
   a substrate configured for electrical connection to a system board;
   a synthesized magnetic layer connected to the substrate, the magnetic layer being formed of magnetic nanoparticles with aligned magnetic domains; and
   an antenna over the magnetic layer.

2. The package of claim 1, further comprising a semiconductor circuit die and wherein the antenna is coupled to the die with vias that extend through the magnetic layer.

3. The package of claim 2, wherein the die is connected to the substrate opposite the antenna and wherein the antenna is coupled to the circuit by vias formed in the substrate.

4. The package of claim 1, wherein the magnetic layer is screen printed over the substrate.

5. The package of claim 1, further comprising a package cover that is formed of a molding compound.

6. The package of claim 1, further comprising a package cover and wherein the magnetic layer is on the substrate and the package cover is formed over the substrate, the magnetic layer and the antenna.

7. The package of claim 1, wherein the antenna is formed of copper plating.

8. The package of claim 1, wherein the magnetic layer is formed of magnetic nanoparticles cured in an epoxy resin.

9. The package of claim 8, wherein the nanoparticies are aligned using a magnetic field while being cured.

10. The package of claim 8, wherein the magnetic nanoparticles comprise passivated silane coated silica particles.

11. The package of claim 1, wherein the magnetic layer comprises a polymeric binder.

12. The package of claim 1, wherein the nanoparticles are passivated and silica coated.

13. The package of claim 1, wherein the magnetic nanoparticles are surface treated with a silane compound.

14. The package of claim 8, wherein the resin is an organic heat cured resin.

15. The package of claim 8, wherein the magnetic nanoparticles fill the resin in excess of 80 volume percent.

16. The package of claim 15, wherein the magnetic particles have a variety of different sizes within a range of between 50 nm and 20 nm.

17. The package of claim 1, wherein the substrate has a top side, the magnetic layer being connected to the top side, and a bottom side, the electrical connection to the system board being on the bottom side, the package further comprising a semiconductor die on the bottom side.

18. The package of claim 1, wherein the semiconductor die is an active analog radio frequency die.

19. The package of claim 17, further comprising metal layers in the substrate to connect the antenna to the semiconductor die.

20. The package of claim 17, further comprising passive elements on the top side of the substrate and coupled to the antenna by vias through the top side.

21. The package of claim 17, wherein the passive elements are attached using an adhesive and the passive elements and the antenna are covered in a mold compound.

22. The package of claim 1, wherein the substrate comprises metal wiring layers coupled to the electrical connections, the package further comprising vias through the magnetic layer to couple the antenna to the metal wiring layer.

23. The package of claim 1, wherein the antenna is pre-formed and attached to the magnetic layer.

24. A computing device comprising:
a system board having a main processor coupled to the system board;
a package having a package substrate coupled to the system board and an antenna, the antenna being formed over a synthesized magnetic layer connected to the substrate, wherein the magnetic layer is formed of magnetic nanoparticles with aligned magnetic domains.

25. The computing device of claim 24, wherein the package further comprises a semiconductor circuit die and wherein the antenna is coupled to the die with vias that extend through the magnetic layer.

26. The computing device of claim 24, wherein the magnetic layer is screen printed over the substrate.

27. The computing device of claim 24, wherein the magnetic layer is on the substrate of the package, the package further comprising a package cover formed over the substrate, the magnetic layer and the antenna.

28. The computing device of claim 24, wherein the antenna is formed of copper plating.

29. The computing device of claim 24, wherein the magnetic layer is formed of magnetic nanoparticles cured in an epoxy resin that are aligned using a magnetic field while being cured.

* * * * *

UNITED STATES PATENT AND TRADEMARK OFFICE
CERTIFICATE OF CORRECTION

PATENT NO. : 9,461,355 B2
APPLICATION NO. : 13/853977
DATED : October 4, 2016
INVENTOR(S) : Nair et al.

Page 1 of 1

It is certified that error appears in the above-identified patent and that said Letters Patent is hereby corrected as shown below:

In the Claims

In column 14, at line 60, delete "nanoparticies" and insert --nanoparticles--.

Signed and Sealed this
Sixth Day of December, 2016

Michelle K. Lee
*Director of the United States Patent and Trademark Office*